United States Patent [19]

Furuhata

[11] Patent Number: 4,740,722
[45] Date of Patent: Apr. 26, 1988

[54] COMPOSITE SEMICONDUCTOR DEVICE

[75] Inventor: Shoichi Furuhata, Kanagawa, Japan

[73] Assignee: Fuji Electric Co., Ltd., Kanagawa, Japan

[21] Appl. No.: 947,863

[22] Filed: Dec. 30, 1986

[30] Foreign Application Priority Data

Jan. 7, 1986 [JP] Japan ................................ 61-1025

[51] Int. Cl.$^4$ .................... H03K 17/04; H03K 17/56; H03K 17/687; H03K 17/72
[52] U.S. Cl. .................................. 307/570; 307/573; 307/633
[58] Field of Search ............... 307/570, 571, 573, 582, 307/252 C, 315

[56]  References Cited
U.S. PATENT DOCUMENTS 4,360,744 11/1982 Taylor ................................ 307/570
4,581,542 4/1986 Steigerwald ........................ 307/570

*Primary Examiner*—John Zazworsky
*Attorney, Agent, or Firm*—Finnegan, Henderson, Farabow, Garrett & Dunner

[57] ABSTRACT

A semiconductor switching device for use with a power source and a load, including a bipolar device including a channel between a first terminal and a second terminal, in cascade with a field effect device including a channel between a first terminal and a second terminal. There is provided means for selectively applying a switching signal to the control terminal of the field effect device to set the channel of the field effect device in a conductive state or a non-conductive state. A capacitor is electrically connected between the control terminal of the bipolar device and a terminal of the field effect device to supply a driving current to the control terminal of the bipolar device when the channel of the field effect device is switched to the conductive state. The control terminal of the bipolar device supplies a charging current to the capacitor when the channel of the field effect device is switched to a non-conductive state. Owing to this simple arrangement, the driving power to the bipolar device is sufficient because of the current from the main circuit and the commutation current from the bipolar device upon turning off of the bipolar device. No special driving power source is required. The saturation voltage of the bipolar device can be reduced, and the power loss in the main circuit can be reduced in comparison with a conventional circuit.

5 Claims, 1 Drawing Sheet

COMPOSITE SEMICONDUCTOR DEVICE

FIELD OF THE INVENTION

The present invention relates to a composite semiconductor device in which a first semiconductor device of the bipolar type and a second semiconductor device of the field effect type are combined as a main circuit element for switching to a load, at high speed, a high voltage and a large current.

BACKGROUND OF THE INVENTION

Referring to FIGS. 2 and 3, the prior art and the problems thereof will be described. FIG. 2 shows an example of a so-called cascode circuit containing a composite semiconductor device, and FIG. 3 shows another example of a circuit containing a composite semiconductor device.

In FIG. 2, the reference numeral 1 designates a power source, 2 a load, 3 a bipolar transistor (hereinafter referred to as BPT), 4 a field effect transistor (hereinafter referred to as FET) of the MOS type or the like in this example, and 6 a Zener diode.

The channel between a collector C and an emitter E of the BPT 3, and the channel between a drain D and a source S of the FET 4, are connected in series with each other at the emitter E and the drain D, so as to switch a current IC (referred to as a collector current herein) supplied from the power source 1 to the load 2. The combination of the transistors 3 and 4 is referred to as a composite transistor herein. The Zener diode 6 is connected between a base B of the BPT 3 and the source S of the FET 4 so as to make the cathode side of the Zener diode 6 connected with the base B.

A switching signal with a voltage $e_G$ for determining whether to turn on/off the collector current IC is applied between a gate G and the source of the FET 4 through a driving circuit (not shown), and, when the FET 4 is to be turned on by rendering the channel conductive, a base current IB 1 is supplied to the base B through a base power source 8 provided between the base B of the BPT 3 and the source S of the FET 4.

This circuit is intended to obtain a composite switching element with high speed and a high withstanding voltage by combining a high speed and low withstanding voltage FET 4 and the low speed and high withstanding voltage bipolar transistor 3. The switching speed of an FET is generally higher than that of a bipolar transistor.

First, the manner of turning on the composite of the transistors 3 and 4 will be described. In this circuit, since the FET 4 is connected with the emitter E of the BPT 3 so as to enable the current IB 1 to be switched, it is possible to apply a relatively high base voltage $e_B$ to the base B of the BPT 3. Therefore, if a switching signal voltage $e_G$ for turning on the transistor 4 is applied to the FET 4, a voltage VDS between the drain D and the source S steeply falls to make the base current IB 1 steeply rise, thereby quickly turning on the BPT 3, so that both transistors 3 and 4 are on. In this case, the Zener diode 6 is in its off-state (non-conductive state).

When the composite transistors 3 and 4 are turned off, on the other hand, if a switching signal voltage $e_G$ for turning off the transistor 4 is applied to the FET 4, the voltage VDS across the drain-source of the FET 4 steeply rises, which cuts off the collector current IC flowing into the FET 4. At that moment, the collector current IC flowing through the base-emitter of the BPT 3 is commutated into the Zener diode 6. The charge carriers at the base portion of the BPT 3 are quickly depleted, and the transistor 3, and hence the composite transistors 3 and 4, are quickly turned off to cut the collector current IC.

The reason why the Zener diode 6 is used in the commutation path is so that the voltage VDS across the drain-source of the FET 4 can be prevented from exceeding a threshold voltage that prevents switching when the FET 4 is to be turned off. When the collector current IC is commutated in the manner described above, the base current IB 1 supplied from the base power source 8 into the base B of the BPT 3 can be prevented from uselessly shunting into the Zener diode 6, and is instead used more efficiently as the base current when the composite transistors 3 and 4 are in the on-state. In the circuit shown in FIG. 2, however, there is concern because the base power source 8 must be separately provided to drive the base of the BPT 3.

FIG. 3 shows a circuit for solving the problem described above for FIG. 2. In the drawing, the reference numeral 5 designates an auxiliary FET which is driven by the same switching signal with voltage $e_G$ as that of FET 4, and which supplies a base current from a power source (the collector C of BPT 3) to the base of BPT 3 when the auxiliary FET is turned on. In the circuit, although the main circuit current can be switched by a single control signal (a switching signal with voltage $e_G$), there are problems because the saturation voltage of the BPT 3 is high due to the operating resistance of the auxiliary FET 5, so the resulting power loss is large. Furthermore, the auxiliary FET 5 is expensive because of its high withstanding voltage characteristics.

SUMMARY OF THE INVENTION

It is an object of the present invention to provide a semiconductor switching device having a semiconductor device of the bipolar type and a semiconductor device of the field-effect type (or the like) connected in cascode. In this invention, the problems in the prior art described above are eliminated. The device is fabricated inexpensively, the generating loss can be kept small, and there is no need for a separate power source.

These and other objects are accomplished by a semiconductor switching device for use with a power source and a load, comprising: a bipolar device including a channel between a first terminal and a second terminal, and a control terminal, with the first terminal being electrically connected to a first side of the power source and the load; a field effect device including a channel between a first terminal and a second terminal, and a control terminal, with the first terminal being electrically connected to a second side of the power source and the load, and with the second terminal of the field effect device being electrically connected to the second terminal of the bipolar device; means for selectively applying a switching signal to the control terminal of the field effect device to set the channel of the field effect device in a conductive or a non-cnoductive state; a capacitor electrically connected between the control terminal of the bipolar device and the first terminal of the field effect device, to supply a driving current to the control terminal of the bipolar device when the channel of the field effect device is switched to a conductive state by the applying means, the control terminal of the bipolar device supplying a first charging current to the capacitor when the channel of the field effect device is switched to the non-conductive state; and means for connecting the capacitor to the power source to supply a second charging current to the capacitor from the power source when the channel of the field effect device is switched to the non-conductive state.

BRIEF DESCRIPTION OF THE DRAWINGS

The accompanying drawings which are incorporated in and constitute a part of the specification, illustrate an embodiment of the invention and, together with the description, serve to explain the principles of the invention.

DETAILED DESCRIPTION OF THE PREFERRED EMBODIMENTS

The subject of the present invention is a capacitor that is charged by the power supply voltage when the composite semiconductor device is in its off-state, and is also charged by a commutation current from a control terminal (a base or the like) of a bipolar semiconductor device. The commutation current is in the direction opposite to the driving current of the bipolar semiconductor device, and is present when the bipolar semiconductor device is being turned off. The capacitor is used as a driving power source for the bipolar semiconductor device.

A composite semiconductor device is provided with a first semiconductor device of the bipolar type (a bipolar transistor, a GTO, or the like) and a second semiconductor device of the field effect type or the like (MOSFET or the like), each having a channel between a first and a second terminal, and a control terminal. The second terminal (emitter, cathode, or the like) of the bipolar device and the second terminal (drain or the like) of the field effect device are connected with each other to form a common terminal. The first terminal (collector, anode, or the like) of the bipolar device and the first terminal (source or the like) of the field effect device are connected with a power source through a load. A switching signal voltage is applied between the control terminal (gate or the like) and the first terminal of the field effect device for selectively setting the channel in a conductive or a non-conductive state so that a current can pass or is cutoff.

Preferably, a parallel circuit including a diode connected with the control terminal (base, gate, or the like) of the bipolar device is provided with a polarity that would block a driving current to the bipolar device. A first resistor connected in parallel with the diode is included, the parallel circuit being connected to the control terminal of the bipolar device and to the capacitor. A second resistor can be connected in parallel with the capacitor; and a third resistor can be connected between the capacitor and either the first terminal of the bipolar device or directly to the power source.

Figure 1A:
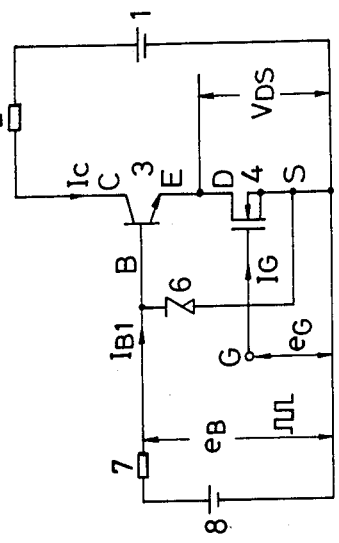
FIG. 1A is a circuit diagram of one embodiment according to the present invention.
Figure 2:
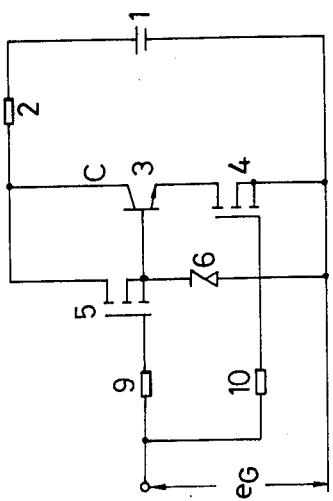
FIG. 2 is a diagram showing an example of the circuit for a conventional device.
Figure 1B:
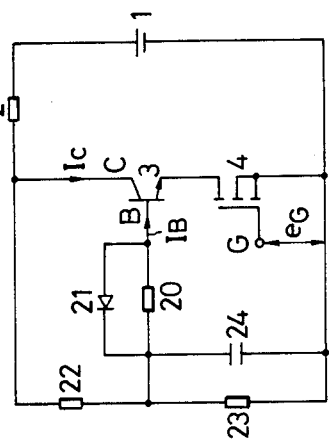
FIG. 1B is a circuit diagram of another embodiment according to the present invention.
Figure 3:
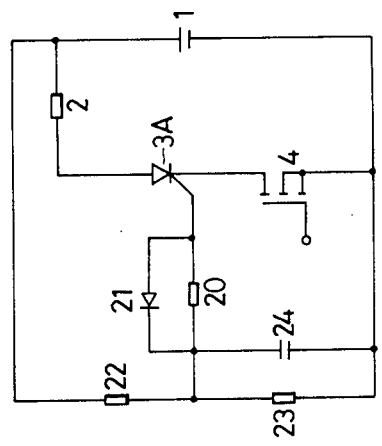
FIG. 3 is a diagram showing another example of the circuit for a conventional device.

Referring to FIGS. 1A and 1B, two embodiments of the present invention will be described. FIGS. 1A and 1B are circuit diagrams of two different embodiments of the present invention. In FIG. 1, instead of a conventional base power source, a capacitor 24 is provided. The capacitor 24 drives the BPT 3 with a driving current to the control terminal when the BPT 3 is in its on-state during a switching operation. The capacitor 24 is charged to an appropriate voltage by a second charging current from the power source 1 by a means for connecting the capacitor to the power source. Preferably, this means is provided by the third resistor 22 and second resistor 23. At the same time, the capacitor is charged via a diode 21 by a first charging current (a commutation current) from the control terminal of the BPT 3 when the BPT 3 is switching to its off-state during a switching operation of the composite transistor.

Although the capacitor is charged from the power source 1 through the load 2 in FIG. 1A, the capacitor 24 is directly charged from the power source 1 in FIG. 1B. In FIG. 1B, a GTO (gate turn-off thyristor) 3A is used as the bipolar device.

In FIG. 1A, when the composite transistors 3 and 4 are in their off-state, the capacitor 24 is charged to a voltage not greater than the withstanding voltage of the FET 4. The path exists from the power source 1 to the load 2, and through the third resistor 22 to the capacitor 24. At that time, the voltage to which the capacitor 24 is charged is in accordance with the ratios of the resistance of third resistor 22 to second resistor 23. The resistor 22 may be directly connected to the power source 1 as shown in FIG. 1B, without being directly connected with the first (collector) terminal C of the BPT 3 as shown in FIG. 1A. The resistance value of the resistor 22 is typically selected to be relatively large. If an on-signal is applied at a first time to the control terminal (gate) of the FET 4 by a means for selectively applying a switching signal, and then an off-signal is applied, the whole of the collector current IC of the BPT 3, which has been the current in the channels of the BPT 3 and the FET 4, is commutated to the base B side of the BPT 3. Almost all of this current is used as the first charging current to the capacitor 24, passing through the diode 21. Accordingly, as long as the capacitor 24 can be charged sufficiently to supply a base current IB to the BPT 3 when an on-signal is applied to the FET 4 at a first time (upon starting), thereafter, it is easy to establish the conditions so that the base current IB needed to turn on the BPT 3 can be obtained as a result of the first charging current supplied from the control terminal or base B (the commutation current of the collector current IC) during the offstate of the BPT 3. This tendency becomes particularly strong when the switching frequency of the composite transistors 3 and 4 is high (about 10 kHz or more).

The second resistor 23 is provided so that the first and second charging currents to the capacitor 24 through the diode 21 or through the resistor 22 do not cause the capacitor voltage to exceed the withstanding voltage of the FET 4. A first resistor 20 operates to limit the base current IB. The discharge current, or driving current, from the capacitor 24 when the FET 4 is turned on is thereby limited. The BPT 3 may be of the Darlington-type or a GTO, as shown in FIG. 1B, so long as it is a semiconductor device of the bipolar-type. The FET 4 is not limited to a transistor of the field-effect type, but any device may be used, so long as the device can block high speed switching. The values of the resistors 22, 23, and 20 and the capacitor 24 are determined in accordance with the turn-off characteristic and amplification factor of the BPT 3 and the main circuit current.

Owing to this simple arrangement, the driving power to the bipolar device is sufficient because of the current from the main circuit and the commutation current from the bipolar device upon turning off of the bipolar device. No special driving power source is required. The saturation voltage of the bipolar device can be reduced, and the power loss in the main circuit can be reduced in comparison with a conventional circuit. There is no power consumption by a Zener diode, unlike the conventional circuit, and the whole of the device can be constructed such that is has an extremely low power loss.

It will be further apparent to those skilled in the art that various modifications and variations can be made to the device of the instant invention without departing from the scope or spirit of the invention, and it is intended that the present invention cover the modifications and variations of the device, provided that they come within the scope of the appended claims and their equivalents.

What is claimed is:

1. A semiconductor switching device for use with a power source connected to a load, comprising:

a bipolar device including a channel between a first terminal and a second terminal, and a control terminal, with said first terminal being electrically connected to the load;

a field effect device including a channel between a first terminal and a second terminal, and a control terminal, with said first terminal being electrically connected to the power source, and with said second terminal of said field effect device being electrically connected to said second terminal of the bipolar device;

means for selectively applying a switching signal to said control terminal of said field effect device to set said channel of said field effect device in a conductive state or a non-conductive state;

a capacitor having a first terminal electrically connected to said control terminal of said bipolar device and a second terminal electrically connected to said first terminal of said field effect device to supply a driving current to said control terminal of the bipolar device when said channel of the field effect device is switched to said conductive state by said applying means, said control terminal of said bipolar device supplying a first charging current to the capacitor when said channel of said field effect device is switched to said non-conductive state;

means for connecting the first terminal of said capacitor to the load to supply a second charging current to said capacitor from the power source when said channel of the field effect device is switched to said non-conductive state;

a first resistor for electrically connecting the first terminal of said capacitor to said control terminal of said bipolar device for limiting the driving current from said capacitor when said channel of said field effect device is switched to said conductive state;

a diode for electrically connecting the first terminal of said capacitor to said control terminal of said bipolar device for passing said first charging current to said capacitor when said channel of said field effect device is switched to said non-conductive state; and a limiting resistor for electrically connecting the first terminal of said capacitor to said first terminal of said field effect device to limit the voltage on said capacitor as a result of said first and second charging currents being supplied to said capacitor.

2. A device according to claim 1, wherein said bipolar device is a bipolar transistor.

3. A device according to claim 1, wherein said bipolar device is a gate turn-off thyristor.

4. A device according to claim 1, wherein said connecting means includes a charging resistor electrically connecting the first terminal of said capacitor to said first terminal of the bipolar device.

5. A device according to claim 1, wherein said connecting means includes a charging resistor electrically connecting the first terminal of said capacitor to a point connecting the power source and the load.

* * * * *